US011416021B2

(12) United States Patent
Xavier et al.

(10) Patent No.: US 11,416,021 B2
(45) Date of Patent: Aug. 16, 2022

(54) CALIBRATION OF SKEW BETWEEN CLOCK PHASES

(71) Applicant: Texas Instruments Incorporated, Dallas, TX (US)

(72) Inventors: Ani Xavier, Bengaluru (IN); Jagannathan Venkataraman, Bengaluru (IN); Raviteja Velisetti, Kukunoor (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/245,711

(22) Filed: Apr. 30, 2021

(65) Prior Publication Data

US 2022/0197330 A1 Jun. 23, 2022

(30) Foreign Application Priority Data

Dec. 22, 2020 (IN) .............................. 202041055927

(51) Int. Cl.
| | |
|---|---|
| *G06F 1/10* | (2006.01) |
| *H03L 7/081* | (2006.01) |
| *H03K 19/20* | (2006.01) |

(52) U.S. Cl.
CPC .............. *G06F 1/10* (2013.01); *H03L 7/0818* (2013.01); *H03K 19/20* (2013.01)

(58) Field of Classification Search
CPC ...... H03K 19/20; H03K 5/135; H03K 5/1565; H03L 7/0818; H03L 7/0807; H03L 7/091; H03L 7/0814; H03L 7/89; H03L 7/087; H03L 7/0891; H03L 7/081; H03L 7/07; H04L 7/033; H04L 7/0337; H04L 7/0008; H04L 7/0331; H04L 7/02; H04L 7/0037; H04L 7/0338; H04L 7/0083
See application file for complete search history.

(56) References Cited

U.S. PATENT DOCUMENTS

| | | | |
|---|---|---|---|
| 6,031,401 A * | 2/2000 | Dasgupta | G06F 1/025 327/116 |
| 2017/0302287 A1* | 10/2017 | Reddy Naru | H03M 1/1038 |
| 2020/0099380 A1* | 3/2020 | Huang | H03L 7/087 |
| 2020/0177130 A1* | 6/2020 | Sharma | H04B 1/0028 |

* cited by examiner

*Primary Examiner* — John W Poos
(74) *Attorney, Agent, or Firm* — John R. Pessetto; Charles A. Brill; Frank D. Cimino

(57) ABSTRACT

A first logic gate has a first input coupled to a first circuit input or a second circuit input, a second input selectively coupled to a third circuit input or a fourth circuit input, and a first output. The first output has a signal with a duty cycle that is a function of a phase difference between a first signal on the first input and a second signal on the second input. A second logic gate has a third input coupled to the third circuit input or the fourth circuit input, a fourth input coupled to the second circuit input or the fourth circuit input, and a second output. The second output has a signal with a duty cycle that is a function of a phase difference between a third signal on the third input and a fourth signal on the fourth input.

24 Claims, 8 Drawing Sheets

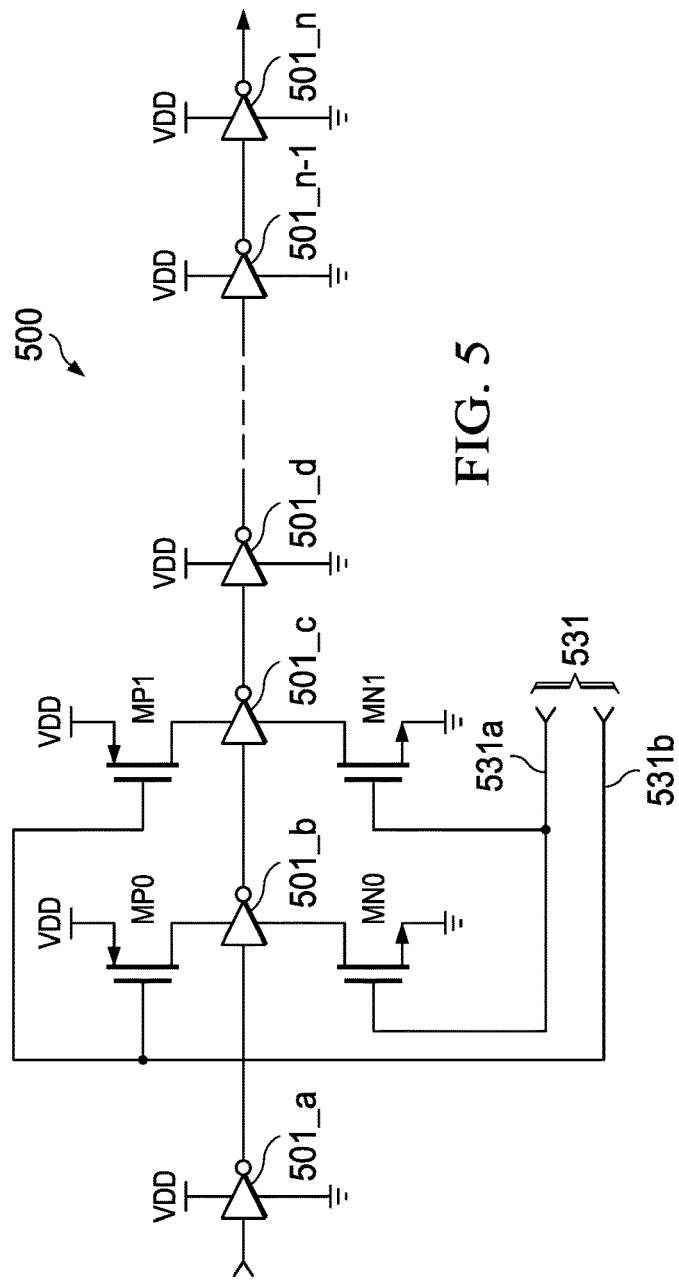
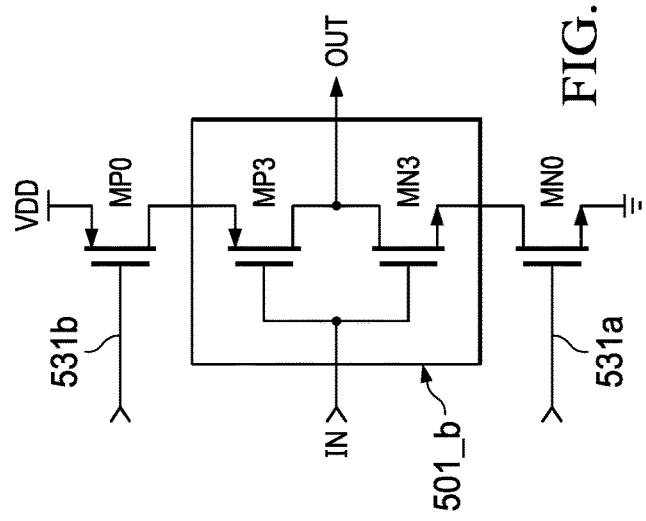
FIG. 5
FIG. 6
FIG. 7

CALIBRATION OF SKEW BETWEEN CLOCK PHASES

CROSS-REFERENCE TO RELATED APPLICATIONS

This application claims priority to India Provisional Application No. 20204105592 filed Dec. 22, 2020, which is hereby incorporated by reference.

BACKGROUND

Data transmission protocols are widely used to transmit and receive data, such as video data. Retimers are electronic devices (that can be protocol specific) that extract data from an incoming encoded data stream and retransmit a fresh copy of the received data using an extracted and refreshed dock signal. Retimers are particularly useful for high-speed data transmissions. For example, retimers can be used to implement universal serial bus (USB), payment card industry (PCI), ethernet, telecommunication and other types of high-speed data communications.

Various types of circuits operate using multiple dock signals (sometimes called docks) that have the same frequency but are phase-shifted from each other. A clock and data recovery (CDR) circuit is an example of a circuit that uses multiple docks, A CDR circuit receives an encoded data stream (e.g., Manchester-encoded data), generates one or more clocks based on the encoded data stream, and uses the clock(s) to recover the underlying data from the encoded data stream. In one example of a CDR, two clocks are generated based on the encoded data stream. The phase of the two docks should be, for example, 180 degrees apart, Edges (e.g., rising edges) of the 180 degree phase-shifted clocks are used to sample the received encoded data stream and the sampled data values are then combined together to reassemble the data that had been encoded in the incoming encoded data stream. Accurate recovery of the data from the encoded data stream benefits from the phase shift between the two clocks being as close to exactly 180 degrees as possible. Other (non-CDR) examples exist in which multiple, phase-shifted clocks are used in which the phase difference between the clocks should be as close as possible to a particular value.

SUMMARY

In at least one embodiment, a first logic gate has a first input coupled to a first circuit input or a second circuit input, a second input selectively coupled to a third circuit input or a fourth circuit input, and a first output. The first output has a signal with a duty cycle that is a function of a phase difference between a first signal on the first input and a second signal on the second input. A second logic gate has a third input coupled to the third circuit input or the fourth circuit input, a fourth input coupled to the second circuit input or the fourth circuit input, and a second output. The second output has a signal with a duty cycle that is a function of a phase difference between a third signal on the third input and a fourth signal on the fourth input.

BRIEF DESCRIPTION OF THE DRAWINGS

For a detailed description of various examples, reference will now be made to the accompanying drawings in which:

FIG. 5 is a circuit diagram of an example implementation of a delay element in FIG. 1.

FIG. 6 is a circuit diagram of an example of one type of inverter stage in the delay element of FIG. 5.

FIG. 7 is a circuit diagram of an example of another type of inverter stage in the delay element of FIG. 5.

The same reference numbers are used in the drawings to designate the same or similar (either functionally and/or structurally) features.

DETAILED DESCRIPTION

Figure 1:
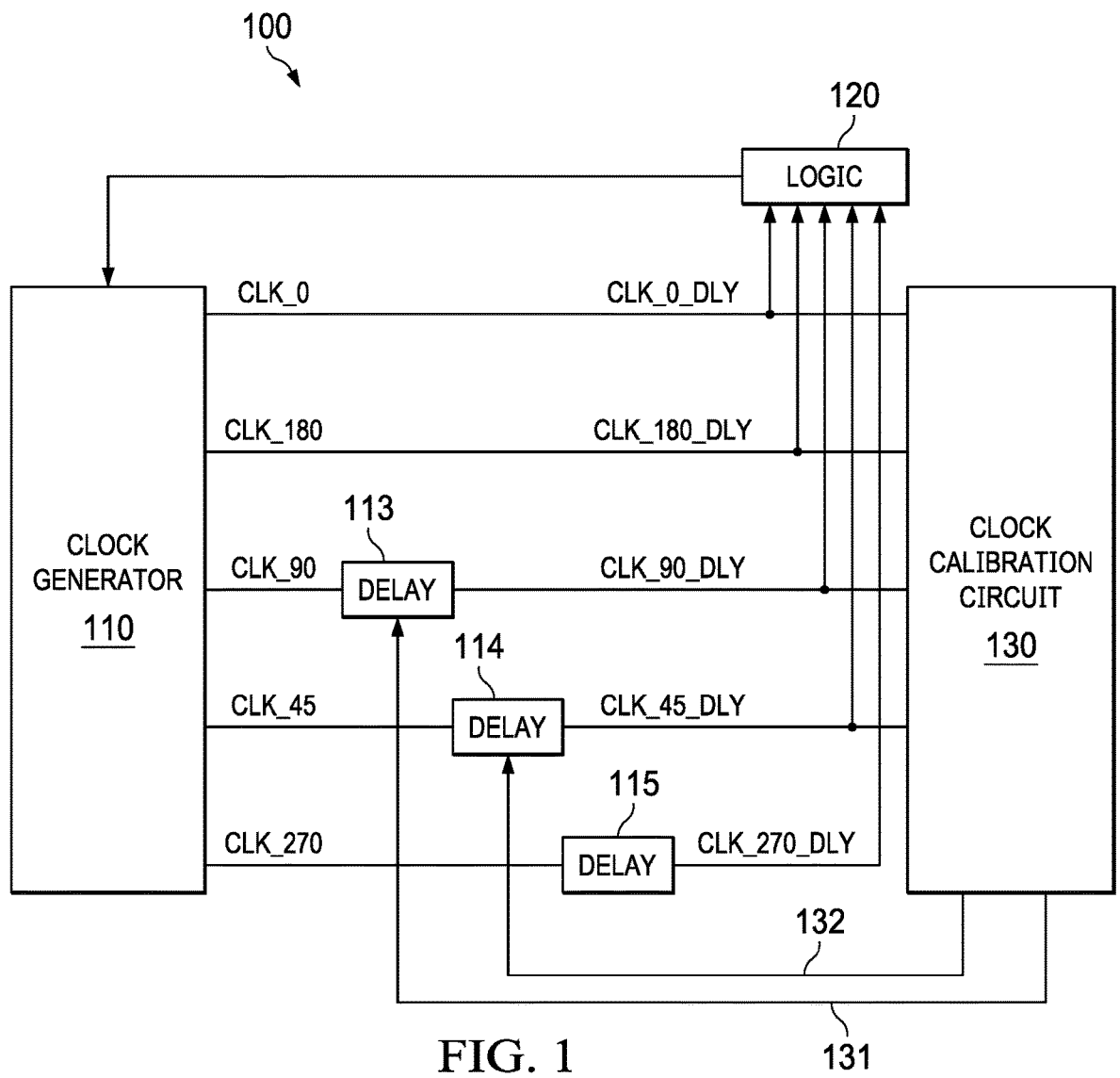
FIG. 1 is a block diagram illustrating an example of a system containing delay elements and a clock calibration circuit operable to calibrate the phase shift of clocks produced by a clock generator.

FIG. 1 is an example of a system 100 containing a clock generator 110, logic 120, and a clock calibration circuit 130. The clock generator 110 generates clock signals (referred to herein as "clocks") whose phases are calibrated by the clock calibration circuit 130 and used by logic 120. An example of a clock generator 110 is included in FIG. 8 and described below. Logic 120 can perform any desired function using the clocks produced by the clock generator 110. One example of logic 120 is a clock and data recovery (CDR) circuit that receives an encoded data stream (e.g., Manchester coding), generates clock(s) based on the received encoded data stream, and uses the generated clocks to recover the original data from the encoded data stream. An example of a CDR-based circuit is included in FIG. 10 and described below.

The clocks generated by the clock generator 110 in the example of FIG. 1 include CLK_0, CLK_45, CLK_90, CLK_180, CLK_270. The numerical references in the clock names refer to the phase shift of each clock relative to CLK_0. That is, CLK_45 is phase shifted with respect to CLK_0 by 45 degrees. CLK_90, CLK_180, and CLK_270 are phased shifted with respect to CLK_0 by 90 degrees, 180 degrees, and 270 degrees, respectively. Additional and/or differently phase-shifted clocks can be generated by the clock generator 110. The phase-shift of the clocks relative to each other depends on the function being performed by logic 120.

Figure 2:
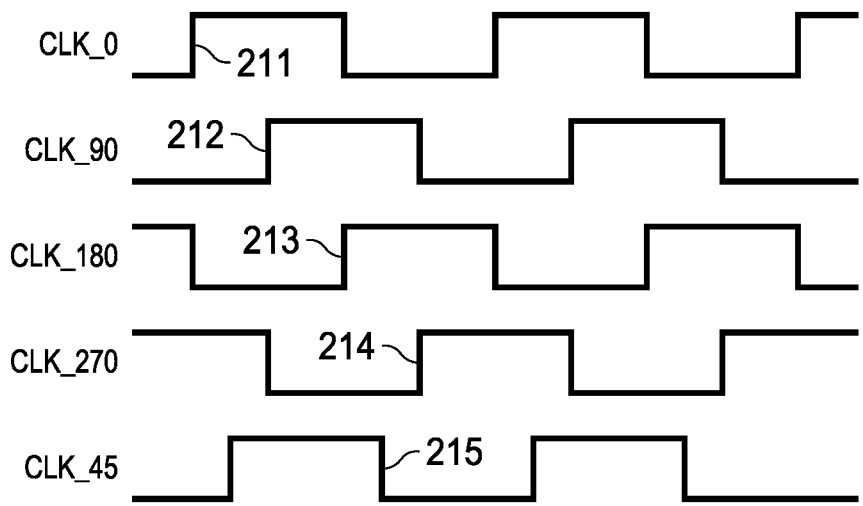
FIG. 2 is a timing diagram illustrating an example of the phase relationship of the clocks produced by the clock generator.

FIG. 2 illustrates the relative phase-shift of the CLK_0, CLK_90, CLK_180, CLK_270 and CLK_45 clocks. Corresponding rising edges of the clocks are identified with reference numerals. CLK_90 has a rising edge 212 that is 90 degrees shifted from corresponding rising edge 211 of CLK_0. Similarly, CLK_180, CLK_270, and CLK_45 have rising edges 213, 214, and 215, respectively, that are 180 degrees, 270 degrees, and 45 degrees phase-shifted with respect to rising edge 211 of CLK_0. If CLK_90 has a precise 90-degree phase shift with respect to CLK_0 and if CLK_180 has a precise 180-degree phase shift with respect to CLK_0, then rising edge 212 of CLK_90 will be halfway in between rising edges 211 and 213. Further, if CLK_45 has a precise 45-degree phase shift with respect to CLK_0 and if CLK_90 has a precise 90-degree phase shift with respect to CLK_0, then rising edge 215 of CLK_45 will be halfway in between rising edges 211 and 212. As will be explained below, the clock calibration circuit 130 adjusts the time delay of delay element 113 to cause the rising edges of CLK_90 to be aligned approximately halfway in between the corresponding rising edges 211 and 213 of CLK_0 and CLK_180, respectively. After calibrating CLK_90 with respect to CLK_0 and CLK_180, the clock calibration circuit 130 then adjusts the time delay of delay element 114 to cause the rising edges of CLK_45 to be aligned approximately halfway in between the corresponding rising edges 211 and 212 of CLK_0 and CLK_90, respectively.

Referring again to FIG. 1, system 100 also includes delay elements 113, 114 and 115. Each delay element has an input (where it receives a clock signal) and an output (where it provides a time-delayed version of the received clock). Delay element 113 receives CLK_90 and produces an output clock, CLK_90_DLY. Delay element 114 receives CLK_45 and produces an output clock, CLK_45_DLY. Delay element 115 receives CLK_270 and produces an output clock, CLK_270_DLY. While a delay element is not shown for either of CLK_0 and CLK_180 in the example of FIG. 1, in other examples, either or both of CLK_0 and CLK_180 can have a delay element. The amount of time delay implemented by delay elements 113 and 114 is configurable. Control signal 131 produced by the clock calibration circuit 130 is provided to a control input of delay element 113 and controls the amount of time delay implemented by delay element 113. Similarly, control signal 132 produced by the clock calibration circuit 130 is provided to a control input of delay element 114 and controls the amount of time delay implemented by delay element 114. The time delay implemented by any additional delay elements (e.g. delay element 115) may or may not be configurable.

Clocks CLK_0_DLY, CLK_180_DLY, CLK_90_DLY, and CLK_45_DLY are provided to the clock calibration circuit 130. As explained above, clock calibration circuit 130 is operable to calibrate CLK_90 with respect to CLK_0 and CLK_180 and then to calibrate CLK_45 with respect to CLK_0 and CLK_90. The calibration is performed by the clock calibration circuit 130 by adjusting the amount of time delay implemented by delay elements 113 and 114 so that: (a) the rising edges of CLK_90_DLY are halfway between corresponding rising edges of CLK_0_DLY and CLK_180_DLY; and (b) the rising edges of CLK_45_DLY are halfway between corresponding rising edges of CLK_0_DLY and CLK_90_DLY. The clock generator 110 produces the clocks CLK_0, CLK_45, CLK_90, CLK_180, and CLK_270 to have approximately the target phase shifts, and the clock calibration circuit 130 further adjusts the phase shifts with respect to the delayed version of the clocks (CLK_0_DLY, CLK_45_DLY, etc.) to result in phase shifts that more closely matches the desired 90-degree and 45-degree phase shifts.

Figure 3:
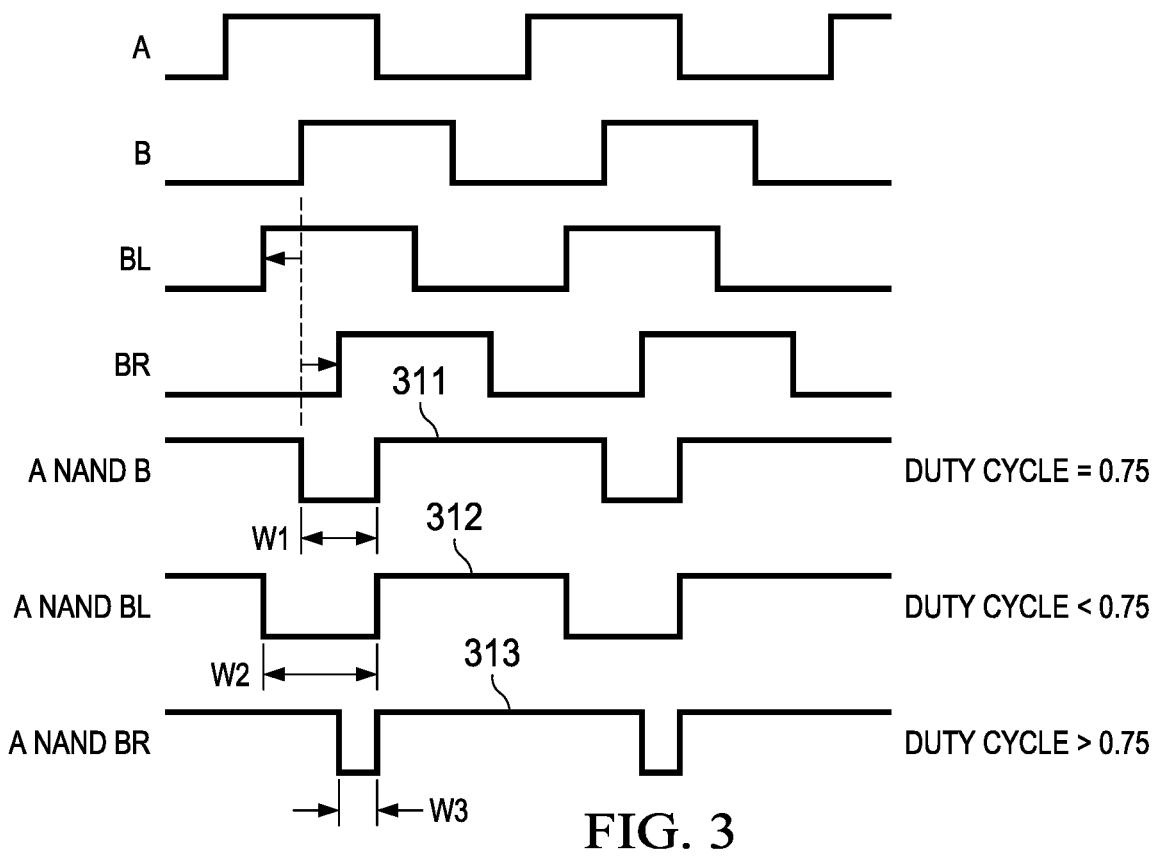
FIG. 3 is a timing diagram illustrating that phase mismatch between a pair of clocks can be detected through analysis of the duty cycle of a signal comprising the logical NAND of the pair of clocks.

FIG. 3 shows an example of two clocks A and B. Clock B is exactly 90 degrees phase-shifted with respect to clock A. Clock BL represents clock B shifted slightly to the left and clock BR represents clock B shifted slightly to the right. Waveform 311 represents the logical NAND of clocks A and B. Per a NAND operation, the output of a NAND gate is logic low (0) only when both inputs to the NAND gate are logic high (1), otherwise, the output is logic high. For waveform 311 (in which clock B is exactly 90 degree phase shifted from clock A), the duty cycle of the waveform is 0.75 (75%).

Waveform 312 represents the NAND of clocks A and BL. Because clock BL slightly leads clock B, the amount of overlap in which both clocks A and BL are high is longer and thus the width W2 of the "low" portions of waveform 312 is larger than the width W1 of the "low" portions of waveform 311. Accordingly, the duty cycle of waveform 312 (in which clock BL is phase-shifted from clock A by less than 90 degrees) is less than 0.75 (less than 75%).

Waveform 313 represents the NAND of clocks A and BR. Because clock BR slightly lags clock B, the amount of overlap in which both clocks A and BR are high is smaller and thus the width W3 of the "low" portions of waveform 313 is smaller than the width W1 of the "low" portions of waveform 311. Accordingly, the duty cycle of waveform 313 (in which clock BR is phase-shifted from clock A by more than 90 degrees) is larger than 0.75 (larger than 75%).

Accordingly, the output signal from the NAND operation has a duty cycle that is a function of a phase difference between signals on the input clocks being NANDed. By NANDing two clock signals together and examining the duty cycle of the resulting NAND gate output signal, it can be determined whether the input clocks are precisely 90 degrees phase-shifted from each other, or whether the phase is shifted less than 90 degrees or more than 90 degrees. The clock calibration circuit 130 includes NAND gates that are used for this purpose as explained below. In alternative embodiments, clock calibration circuit 130 includes other logical functions instead of or in addition to the NAND functions.

Figure 4:
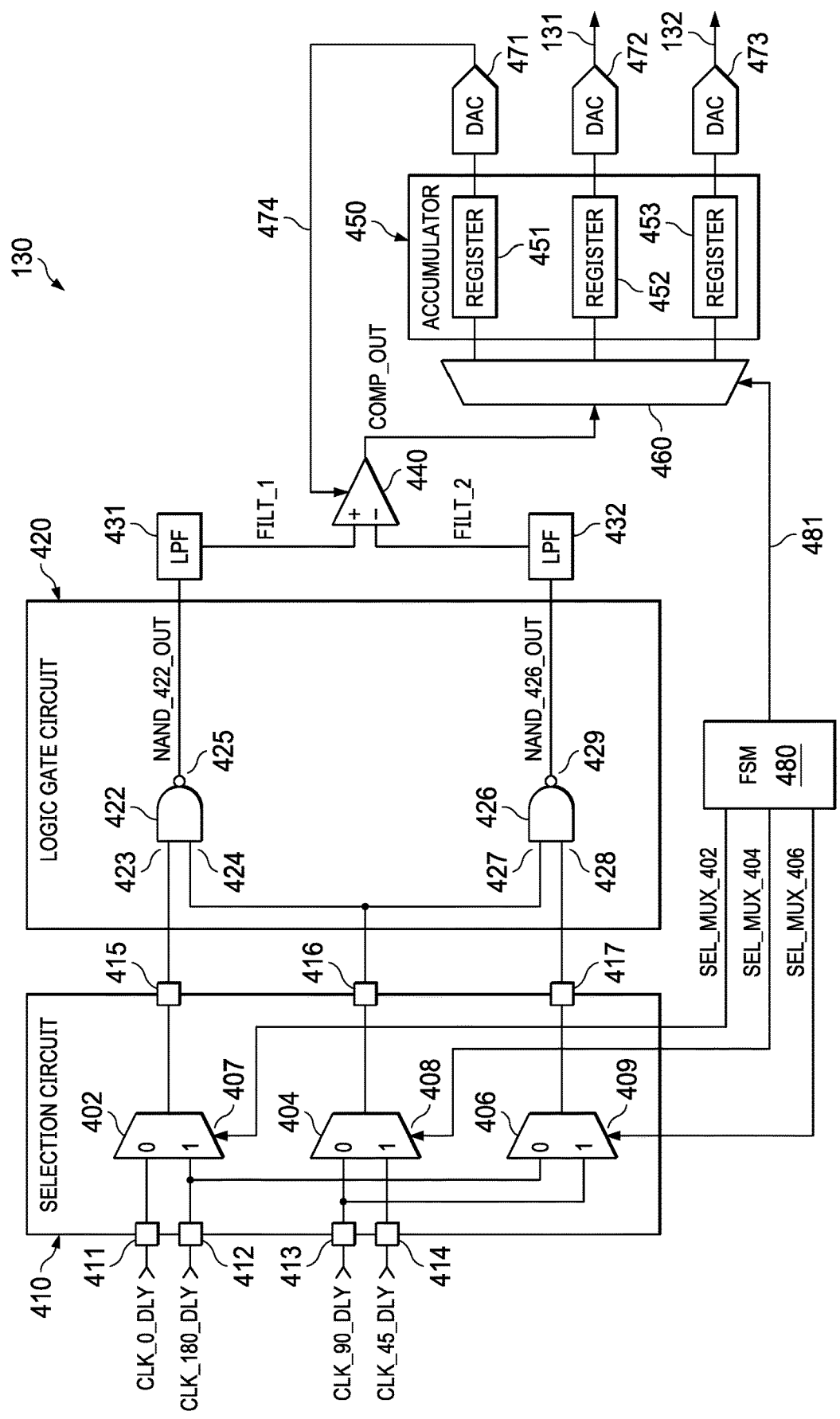
FIG. 4 is a block diagram of an example implementation of the clock calibration circuit of FIG. 1.

FIG. 4 includes an example implementation of clock calibration circuit 130. In this example, the clock calibration circuit 130 includes a selection circuit 410, logic gate circuit 420, low pass filters 431 and 432, a comparator 440, an accumulator 450, a demultiplexer 460, digital-to-analog converters (DACs) 471, 472, and 473, and a finite state machine 480. The selection circuit 410 includes inputs 411, 412, 413, and 414 as well as outputs 415, 416, and 417. CLK_0_DLY is coupled to input 411. CLK_180_DLY is coupled to input 412. CLK_90_DLY is coupled to input 413, and CLK_45_DLY is coupled to input 414. The selection circuit 410 includes multiplexers 402, 404, and 406. Each multiplexer has a "0" input and a "1" input. Via selection circuit input 411, CLK_0_DLY is couple to the 0-input of multiplexer 402. Via selection circuit input 412, CLK_180_DLY is couple to the 1-input of multiplexer 402 and to the 0-input of multiplexer 406. Via selection circuit input 413, CLK_90_DLY is couple to the 0-input of multiplexer 404. Via selection circuit input 414, CLK_45_DLY is couple to the 1-input of multiplexer 404 and to the 1-input of multiplexer 406.

The finite state machine 480 generates selection signals SEL_MUX_402, SEL_MUX_404, and SEL_MUX_406 which are selection signals coupled to selection inputs 407, 408, and 409, respectively, of the multiplexers 402, 404, and 406. Selection signal SEL_MUX_402 causes multiplexer 402 to couple the signal on either its 0-input (CLK_0_DLY) or its 1-input (CLK_180_DLY) to selection circuit output 415. Selection signal SEL_MUX_404 causes multiplexer 404 to couple the signal on either its 0-input (CLK_90_DLY) or its 1-input (CLK_45_DLY) to selection circuit output 416. Selection signal SEL_MUX_406 causes multiplexer 406 to couple the signal on either its 0-input (CLK_180_DLY) or its 1-input (CLK_90_DLY) to selection circuit output 415.

The logic gate circuit 420 in this example includes NAND gates 422 and 426. NAND gate 422 has input 423 and 424 and an output 425. The signal generated by NAND gate 422 on its output 425 is NAND_422_OUT. NAND gate 426 has input 427 and 428 and an output 429, and the signal generated by NAND gate 426 on its output 429 is NAND_426_OUT. Inputs 423 and 424 of NAND gate 422 are coupled to selection circuit outputs 415 and 416, respectively. Inputs 427 and 428 of NAND gate 426 are coupled to selection circuit outputs 416 and 417, respectively. Through assertion of selection signals SEL_MUX_402 and SEL_MUX_404, NAND gate 422 can logically NAND gate together at least the following pairs of clocks:
  (a) CLK_0_DLY (from multiplexer 402) and CLK_90_DLY (from multiplexer 404),
  (b) CLK_0_DLY (from multiplexer 402) and CLK_45_DLY (from multiplexer 404), or
  (c) CLK_180_DLY (from multiplexer 402) and CLK_90_DLY (from multiplexer 404).
Similarly, through assertion of selection signals SEL_MUX_404 and SEL_MUX_406, NAND gate 426 can logically NAND gate together at least the following pairs of clocks:
  (a) CLK_90_DLY (from multiplexer 404) and CLK_180_DLY (from multiplexer 406), or
  (b) CLK_45_DLY (from multiplexer 404) and CLK_90_DLY (from multiplexer 406).
Other combinations of clocks also can be selected for NANDing together via the NAND gates 422 and 426.

The finite state machine 480 may comprise, for example, a combination of logic gates, flip-flops, registers, etc. and implements multiple states. In one state, the selection signals to the multiplexers 402, 404, and 406 are controlled so that NAND gate 422 NANDs CLK_0_DLY and CLK_90_DLY at the same time that NAND gate 426 NANDs CLK_90_DLY and CLK_180_DLY. Assuming that the rising edges of CLK_90_DLY are halfway between the corresponding rising edges of CLK_0_DLY and CLK_180_DLY (see explanation above regarding FIG. 3), the phase difference between CLK_0_DLY and CLK_90_DLY should be 90 degrees, and the phase difference between CLK_90_DLY and CLK_180_DLY also should be 90 degrees. If that is the case, then the duty cycle of the NAND_422_OUT and NAND_426_OUT from NAND gates 422 and 426 both should be 0.75.

The output signals NAND_422_OUT and NAND_426_OUT from NAND gates 422 and 426 are coupled inputs of corresponding low-pass filters 431 and 432. Each low pass filter may be implemented as a resistor coupled to a capacitor (an "RC" low pass filter), but each filter can be implemented with other suitable filter architectures (e.g., a digital low pass filter). The output signal (e.g., a voltage) from low pass filter 431 is designated FILT_1, and the output signal from low pass filter 432 is designated FILT_2. By low pass filtering the respective NAND gate output signal (NAND_422_OUT and NAND_426_OUT), a voltage proportional to the duty cycle of the NAND gate's output signal is generated by the low pass filter. That is, the magnitude of FILT_1 from low pass filter 431 is proportional to the duty cycle of the output signal NAND_422_OUT from NAND gate 422. Similarly, the magnitude of FILT_2 from low pass filter 432 is proportional to the duty cycle of NAND_426_OUT from NAND gate 426.

In the case in which CLK_90_DLY is phase shifted from CLK_0_DLY and CLK_180_DLY by precisely 90 degrees, then the magnitude of FILT_1 will be equal to the magnitude of FILT_2. However, if CLK_90_DLY is phase shifted from CLK_0_DLY by less than 90 degrees (the rising edges of CLK_90_DLY are closer to the corresponding rising edges of CLK_0_DLY than to the rising edges of CLK_180_DLY), then the duty cycle of NAND_422_OUT will be less than 0.75 and the duty cycle of NAND_426_OUT will be greater than 0.75, and thus the magnitude of FILT_1 will be smaller than the magnitude of FILT_2. Further, if CLK_90_DLY is phase shifted from CLK_0_DLY by more than 90 degrees (the rising edges of CLK_90_DLY are closer to the corresponding rising edges of CLK_180_DLY than to the rising edges of CLK_0_DLY), then the duty cycle of NAND_422_OUT will be greater than 0.75 and the duty cycle of NAND_426_OUT will be less than 0.75, and thus the magnitude of FILT_1 will be larger than the magnitude of FILT_2.

The comparator 440 has a non-inverting (positive (+)) input and an inverting (negative (−)) input. The output of low pass filter 431 is coupled to the positive input of comparator 440, and the output of low pass filter 432 is coupled to the negative input of the comparator (although the connections between the filters and the comparator inputs can be reversed from that shown in FIG. 4). The comparison of FILT_1 to FILT_2 provides an indication as to whether the magnitudes of FILT_1 and FILT_2 are approximately equal, or whether FILT_1 is larger or smaller than FILT_2. If FILT_1 is larger or smaller than FILT_2, then the delay implemented by delay element 113 should be adjusted. For example, FILT_1 being smaller than FILT_2 indicates that the rising edges of CLK_90_DLY are closer to CLK_0_DLY than to CLK_180_DLY, and thus that the delay of CLK_90_DLY should be increased. FILT_1 being larger than FILT_2 indicates that the rising edges of CLK_90_DLY are closer to CLK_180_DLY than to CLK_0_DLY, and thus that the delay of CLK_90_DLY should be decreased.

The output signal, COMP_OUT, from comparator 440 is either high or low. The comparator 440 implements a configurable offset (e.g., 100 millivolts), described below. For COMP_OUT to be forced high by the comparator 440, the voltage on the positive input (FILT_1) must be more than the offset voltage (e.g., 100 millivolts) larger than the voltage on the negative input (FILT_2). With FILT_1 coupled to the positive comparator input and FILT_2 coupled to the negative input, COMP_OUT will be high when FILT_1 is larger than FILT_2 (by at least the offset voltage), and low otherwise. Accordingly, COMP_OUT indicates whether the duty cycle of NAND_422_OUT is larger or smaller than the duty cycle of NAND_426_OUT.

If the duty cycles of NAND_422_OUT and NAND_426_OUT are so close so as to be approximately the same, any noise on FILT_1 and/or FILT_2 may cause COMP_OUT to be incorrect. To avoid such errors, the accumulator 450 accumulates COMP_OUT from comparator 440, via demultiplexer 460 (which is controlled by the FSM 480). If the only difference between FILT_1 and FILT_2 is due to noise (which is pseudo random), then COMP_OUT will likely toggle repeatedly between high and low. The accumulator 450 includes one or more counters that counts the number of highs (1's) and lows (0's) from the comparator and stores the accumulated count value in one or more registers 451, 452, and 453 (whose use is described below). If the only difference between FILT_1 and FILT_2 is due to noise, then the accumulator will count approximately the same number of 1's as 0's from the comparator 440. If FILT_1 is larger than FILT_2 due to the duty cycle of NAND_422_OUT being larger than the duty cycle of NAND_426_OUT, then the accumulator 450 will count more 1's than 0's. If FILT_1 is smaller than FILT_2 due to the duty cycle of NAND_422_OUT being smaller than the duty cycle of NAND_426_OUT, then the accumulator 450 will count more 0's than 1's.

As explained above, via the selection signals SEL_MUX_402, SEL_MUX_404 and SEL_MUX_406, the finite state machine 480 controls the selection circuit 410 to cause the logic gate circuit 420 to determine the NAND of CLK_0_DLY and CLK_90_DLY (NAND_422_OUT) and the NAND of CLK_90_DLY and CLK_180_DLY (NAND_426_OUT). The accumulated value in accumulator 450 indicates whether the duty cycles of NAND_422_OUT and NAND_426_OUT are the same or different. If the accumulator 450 counts approximately the same number of 0's as 1's, then the duty cycle of CLK_90_DLY is determined to be properly phase shifted with respect to CLK_0_DLY and CLK_180_DLY and no further adjustment in the delay implemented by delay element 113 is needed.

However, the duty cycle of NAND_422_OUT being smaller than the duty cycle of NAND_426_OUT indicates that CLK_90_DLY is phase shifted with respect to CLK_0_DLY by less than 90 degrees and thus is phase shifted with respect to CLK_180_DLY by more than 90 degrees. This case is detected by the accumulator 450 counting more 0's than 1's from the comparator 440. In this case, the clock calibration circuit 130 generates control signal 131 (as explained below), which is provided to delay element 113, to cause the delay element to implement a larger amount of time delay for CLK_90_DLY.

Similarly, the duty cycle of NAND_422_OUT being larger than the duty cycle of NAND_426_OUT indicates that CLK_90_DLY is phase shifted with respect to CLK_0_DLY by more than 90 degrees and thus is phase shifted with respect to CLK_180_DLY by less than 90 degrees. This case is detected by the accumulator 450 counting more 1's than 0's from the comparator 440. In this case, the clock calibration circuit 130 generates control signal 131 to cause the delay element 113 to implement a smaller amount of time delay for CLK_90_DLY.

The accumulated COMP_OUT value is stored in one of the registers of accumulator 450 (e.g., register 452) for the case in which the logic gate circuit 420 NANDs CLK_0_DLY and CLK_90_DLY and NANDS CLK_90_DLY and CLK_180_DLY. At the same time that the finite state machine 480 controls the selection circuit 410 to provide CLK_0_DLY, CLK_90_DLY, and CLK_180_DLY to the inputs of the NAND gates 422 and 426 as explained above, the finite state machine 480 also asserts control signal 481 to cause the demultiplexer 460 to provide the output signal, COMP_OUT, from comparator 440 to accumulator 450 to be accumulated and stored in register 452. From register 452 the accumulated value is provided to DAC 472 for conversion to analog control signal 131.

The DACs 471, 472 and 473 may be implemented as any suitable type of DAC. DAC 472 converts the accumulated value from register 452 (which indicates whether CLK_90_DLY is properly aligned to CLK_0_DLY and CLK_180_DLY or whether CLK_90_DLY lags or leads its proper phase alignment). The accumulated value from register 452 is converted to an analog signal (e.g., an analog voltage) as control signal 131, which is provided to delay element 113. The process repeats with each subsequent iteration to potentially adjust the delay for CLK_90_DLY beginning with the previous accumulated value in register 452.

Upon CLK_90_DLY being properly aligned (a condition detected by the accumulator 450 counting approximately equals numbers of 1's and 0's), the finite state machine 480 changes the selection signals SEL_MUX_402 to cause multiplexer 402 to select its 0-input (or maintains SEL_MUX_402 in the same state if it was already set to select the 0-input), SEL_MUX_404 to cause multiplexer 404 to select its 1-input, and SEL_MUX_406 to cause multiplexer 406 to select its 1-input. The finite state machine 480 also adjusts control signal 481 to cause the demultiplexer 460 to provide COMP_OUT from comparator 440 to the accumulator 450 for accumulation and storage in accumulator register 453. From accumulation register 453, the accumulated value is provided to DAC 473. With this configuration of signals from the finite state machine 480, the logic gate circuit 420 NANDs CLK_0_DLY and CLK_45_DLY as NAND gate 422 output signal NAND_422_OUT and NANDs CLK_45_DLY and CLK_90_DLY as NAND gate 426 output signal NAND_426_OUT. In this configuration, the clock calibration circuit 130 thus determines whether CLK_45_DLY is properly aligned to CLK_0_DLY and CLK_90_DLY. If properly aligned, CLK_45_DLY should be phase shifted by 45 degrees with respect to CLK_0_DLY and with respect to CLK_90_DLY as shown in FIG. 2. The operation of the NAND gates 422 and 426, low pass filters 431 and 432, comparator 440, and accumulator 450 is the same as described above. The resulting accumulated value is stored in register 453 and, via demultiplexer 460, provided to DAC 473. DAC 473 converts the accumulated value to an analog signal and provides the resulting analog signal (control signal 132) to delay element 114 to adjust the time delay implemented by delay element 114. The process repeats for determining whether the CLK_45_DLY is properly aligned and, if not, adjusting the time delay of delay element 114. Thus, the clock calibration circuit 130 first adjusts the delay for CLK_90_DLY to thereby align CLK_90_DLY with respect to CLK_0_DLY and CLK_180_DLY, and then adjusts the delay for CLK_45_DLY to thereby align CLK_45_DLY with respect to CLK_0_DLY and CLK_90_DLY.

FIG. 5 shows an example implementation of a delay element 500 that can be used for either or both of delay elements 113 or 114. Delay element 500 includes a series-connected chain of inverters 501_a, 501_b, 501_c, 501_d, 501_n-1, and 501_n. Any suitable number of inverters can be included. Inverters 501_a, 501_d, 501_n-1, and 501_n are connected to the power supply (VDD) and ground as shown.

Inverters 501_b and 501_c, however, are not connected directly to VDD and ground. Instead, a first transistor is coupled between each inverter and VDD, and a second transistor is coupled between each inverter and ground. Transistor MP0 is coupled between inverter 501_b and VDD, and transistor MN0 is coupled between inverter 501_b and ground. Similarly, transistor MP1 is coupled between inverter 501_c and VDD, and transistor MN1 is coupled between inverter 501_c and ground. In this example, transistors MP0 and MP1 are P-type metal oxide semiconductor field effect transistors (PMOS transistors), and transistors MN0 and MN1 are N-type metal oxide semiconductor field effect transistors (NMOS transistors). The transistors can be implemented as different types of transistors from that shown (e.g., bipolar junction transistors in placep of metal oxide semiconductor field effect transistors, etc.). A transistor has a control input and a pair of current terminals. The gate and current terminals of a metal oxide semiconductor field effect transistor is the transistor's gate, drain, and source, respectively. The gate and current terminals of a bipolar junction transistor is the transistor's base, emitter, and collector, respectively.

Reference numeral 531 refers to a control signal (e.g., control signal 131 from DAC 472 or control signal 132 from DAC 473). Control signal 531 comprises a pair of signals 531a and 531b as shown. Signal 531a is coupled to the gates of transistors MN0 and MN1, and signal 531b is coupled to the gates of transistors MP0 and MP1. In part, the gate-to-source voltage (Vgs) of a PMOS or NMOS transistor controls the drain current through the transistor. The control signal 531 thus controls the current through inverters 501_b and 501_c. The current that is permitted to flow through the inverters 501_b and 501_c also influences the rising and falling edges of the output signals from the inverter, and thus influences the time delay of inverters 501_b and 501_c.

FIG. 6 illustrates an example of inverter 501_a, which also is applicable to inverters 501_d, 501_n–1, and 501_n. In this example, the inverter 501_a includes a PMOS transistor MP2 coupled to an NMOS transistor MN2. The drains of transistors MP2 and MN2 are coupled together and provide the output signal (OUT) 610 from the inverter. The gates of transistors MP2 and MN2 are coupled together and provide the input signal (IN) 605 to the inverter. The source of transistor MP2 is couple to VDD, and the source of transistor MN2 is coupled to ground. Input signal 605 being above the threshold voltage of transistor MN2 causes transistor MN2 to be on thereby pulling the output signal 610 low. Input signal 605 being more than the threshold voltage of transistor MP2 below its source (VDD) causes transistor MP2 to be on thereby forcing the output signal 610 high.

FIG. 7 shows an example implementation for inverter 501_b (also applicable to inverter 501_c). Transistors MP3 and MN3 are equivalent to transistors MP2 and MN2 in FIG. 6. Instead of the source of transistor MP3 being connected to VDD, the source of transistor MP3 is connected to the drain of transistor MP0, and the source of transistor MP0 is connected VDD. Further, instead of the source of transistor MN3 being connected to ground, the source of transistor MN3 is connected to the drain of transistor MN0, and the source of transistor MN0 is connected ground. By modulating the Vgs of transistors MP0 and MN0, the current that flows through MP3 (when IN is low) or through MN3 (when IN is high) can be controlled, and by controlling the current, the propagation time in transitioning transistors MP3 and MN3 between their ON and OFF states can be controlled.

To increase the propagation time through inverters 501_b and 501_c (and thus to increase the delay implemented by the delay element (e.g., delay element 113 or 114) containing inverters 501_b and 501_c), the Vgs of transistors MP0 and MN0 should be increased. Increasing the Vgs of transistor MP0 requires the voltage of signal 531b to be decreased and the voltage of signal 531a to be increased. To decrease the propagation time through inverters 501_b and 501_c (and thus to reduce the delay of the corresponding delay element), the Vgs of transistors MP0 and MN0 should be decreased. Decreasing the Vgs of transistor MP0 requires the voltage of signal 531b to be increased and the voltage of signal 531a to be decreased.

The DACs 472 and 473 generate the pair of signals 531a and 531b for the respective control signals 131 and 132. In one example, each DAC is implemented as a resistive ladder with a current flowing therethrough. Different voltages are generated at the different connection points between resistors in the ladder, and multiplexers are configured to tap the target voltages for the control signals 131 and 132.

Figure 8:
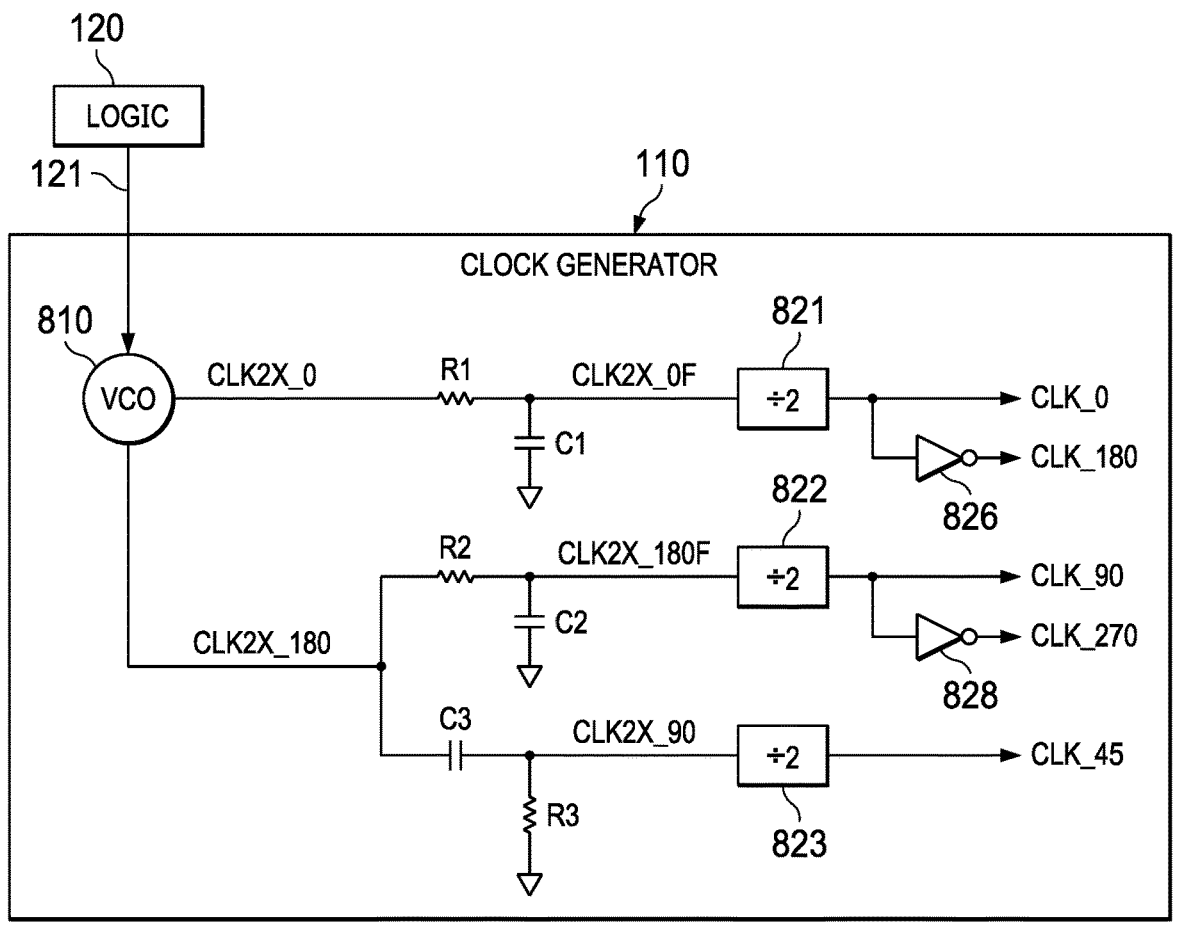
FIG. 8 is a block diagram of an example implementation of the clock generator of FIG. 1.

FIG. 8 shows an example implementation of the clock generator 110. Logic 120 generates a control signal 121 to a voltage-controlled oscillator (VCO) 810. The VCO 810 responds to the control signal 121 by generating clocks CLK2X_0 and CLK2X_180. The control signal 121 indicates whether the VCO should increase or decrease the frequency of CLK2X_0 and CLK2X_180 (e.g., one or more up pulses or one or more down pulses). CLK2X_0 is a clock that has twice the frequency (hence "2X") than CLK_0. CLK2X_180 is 180 degrees out of phase with respect to CLK2X_0. In one example, CLK2X_180 is the output signal from an inverter and CLK2X_0 is the input signal to the inverter.

The clock generator 110 also includes resistors R1, R2, and R3, capacitors C1, C2, and C3, frequency dividers 821, 822, and 823, and inverters 826 and 828. In one example, the resistance values of resistors R1-R3 are the same (R1=R2=R3), and the capacitance values of capacitors C1-C3 are the same (C1=C2=C3). Each frequency divider 821-823 in the example of FIG. 8 receives a clock signal and generates an output clock that has a frequency that is approximately one-half the frequency of its input clock.

Resistor R1 is coupled to capacitor C1 in a low pass filter configuration. Similarly, resistor R2 is coupled to capacitor C2 in a low pass filter configuration. Capacitor C3 is coupled to resistor R3 in a high pass filter configuration. CLK2X_0 is coupled to the low pass filter comprising resistor R1 and capacitor C1, the output clock from which is called CLK2X_0F. CLK2X_180 is coupled both to the low pass filter comprising resistor R2 and capacitor C2 and to the high pass filter comprising capacitor C3 and resistor R3, thereby generating output clocks CLK2X_180F and CLK2X_90, respectively. The clock signals are determined from the following equations:

$$CLK2X\_0F = CLK2X\_0 \times \left(\frac{1}{1+S\,RC}\right) \quad (1)$$

$$CLK2X\_90 = CLK2X\_180 \times \left(\frac{s\,RC}{1+S\,RC}\right) \quad (2)$$

For a sinusoidal VCO clock, $$\frac{CLK2X\_90}{CLK2X\_0F} = j \times \left(\frac{W\,RC}{1}\right),$$

and thus there is 90-degree phase separation between CLK2X_90 and CLK2X_0F.

Frequency divider 821 receives CLK2X_0F and generates CLK_0, which has half the frequency of CLK2X_0F. Inverter 826 is coupled to the output of frequency divider 821 and generates CLK_180. Similarly, frequency divide 822 receives CLK2X_180F and generates CLK_90, which has half the frequency of CLK2X_180F. Inverter 828 is coupled to the output of frequency divider 822 and generates CLK_270. CLK_45 is generated by frequency divider 823, the input of which receives CLK2X_90.

It is desirable for the clocks generated by the VCO 810, e.g. CLK2X_0 and CLK2X_180, to have a 50% duty cycle. Any duty cycle errors (duty cycles other than 50%) will adversely affect all clocks derived therefrom. Further, even if the VCO 810 is able to generate CLK2X_0 and CLK2X_180 with 50% duty cycles, any mismatches in the resistors (e.g., R1 and R2) and/or capacitors (e.g., C1 and C2) will cause the corner frequencies of the filters to differ from each other, which can also cause errors in the duty cycles of the resulting filtered clocks. Regardless of the reasons for errors in the duty cycles of the clocks used by logic 120, the clock calibration circuit 130 adjusts the delays of at least some of the clocks to ensure that the clocks are properly aligned as described above.

Referring again to FIG. 4, in addition to calibrating (a) CLK_90 with respect to CLK_0 and CLK_180, and (b) CLK_45 with respect to CLK_0 and CLK_90, mismatches between the NAND gates 422 and 427 as well as the offset within the comparator 440 can impact the accuracy of the calibration process. Any fabricated element is subject to a degree of mismatching as dictated by the process technology used to fabricate the part. The metal oxide semiconductor field effect transistors (MOSFETS), which are the constituent circuit components for NAND gates and comparators, inherit the mismatch non-idealities of their constituent transistors which is manifested variations in the threshold voltage (Vt), offset, and drive strength. Accordingly, any two similar instances of NAND gates may not have the same rise and fall times. For a comparator, the transistors used as the input pair of the differential structure will have different threshold voltages and a comparator will have a finite offset.

To calibrate the NAND gates 422 and 426 and the comparator 440, the finite state machine 480 controls the selection signals, SEL_MUX_402, SEL_MUX_404, and SEL_MUX_406 to thereby cause the same clock signals to be provided to the inputs 423 and 424 of NAND gate 422 and to the inputs 427 and 428 of NAND gate 426. With the same input clocks to the NAND gates, NAND_422_OUT should be identical to NAND_426_OUT, and any misalignment in the output clocks will be due to mismatches between the NAND gates. Further, even if the NAND gates have no mismatch between them, offset in the comparator 440 can cause COMP_OUT to be biased according to the magnitude and sign of the comparator offset.

In one example, the finite state machine 480 uses SEL_MUX_402 to cause multiplexer 402 to select its 1-input, SEL_MUX_404 to cause multiplexer 404 to select its 0-input, and SEL_MUX_406 to cause multiplexer 406 to select its 0-input. Accordingly, the inputs 423 and 424 of NAND gate 422 will receive CLK_180_DLY and CLK_90_DLY, respectively, and the inputs 427 and 428 of NAND gate 426 will receive CLK_90_DLY and CLK_180_DLY, respectively. The process described above regarding the low pass filters 431 and 432, the comparator 440, and the accumulator 460 occurs, with the accumulated comparator result stored in register 451. DAC 471 converts the accumulated value from register 451 to an analog control signal 474 (e.g., an analog voltage) and provides the analog control signal to the comparator 440. The comparator 440 adjusts its offset based on the analog control signal 474. Adjustments to the offset of the comparator 440 can be made to account for the combination of the NAND gate mismatches and comparator offset mismatch.

Figure 9:
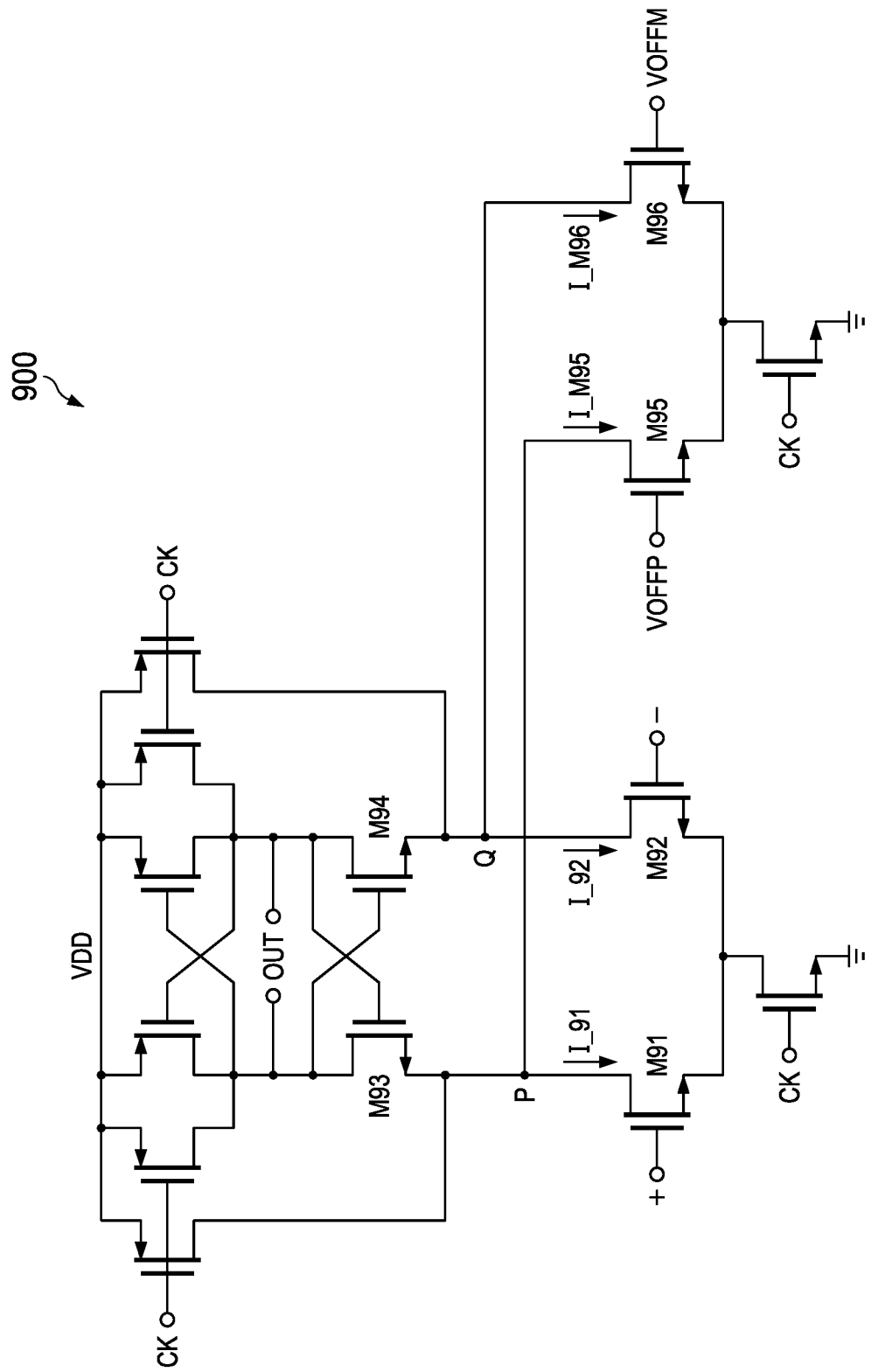
FIG. 9 is a circuit diagram of an example implementation of a configurable comparator.

FIG. 9 shows an example of a comparator 900 usable as the comparator 440 described above. Comparator 900 includes an input transistor pair comprising NMOS transistors M91 and M92. The gate of transistor M91 represents the non-inverting (positive (+)) input of the comparator and the gate of transistor M92 represents the inverting (negative (−)) input. Transistor M91 is coupled to transistor M93 and transistor M92 is coupled to transistor M94. The drains of transistors M93 and M94 provide the output of the comparator.

Transistor M95 is coupled to the drain of transistor M91 and transistor M96 is coupled to the drain of transistor M92. The gate of transistor M95 receives an input control voltage VOFFP, and the gate of transistor M96 receives an input control voltage VOFFM. Control voltages VOFFP and VOFFM collectively represent the analog control signal 474. That is, in this example, the analog control signal 474 comprises a pair of voltages generated by DAC 471 that are provided to the gates of the respective transistors M95 and M96. The voltage on the gate of transistor M95 controls the gate-to-source voltage (Vgs) of transistor M95 and thus the current I_M95 that flows through transistor M95. By varying the current I_M95 that flows through transistor M95, the current through transistor M91 (I_M91) can be increased or decreased (an increase in I_M95 results in a corresponding decrease in I_M91, and vice versa). Similarly, the current I_M92 through transistor M92 can be increased or decreased by varying the gate voltage (VOFFM) on the gate of transistor M96. By independently controlling the current through each transistor M91 and M92, the offset of the comparator can be adjusted.

Figure 10:
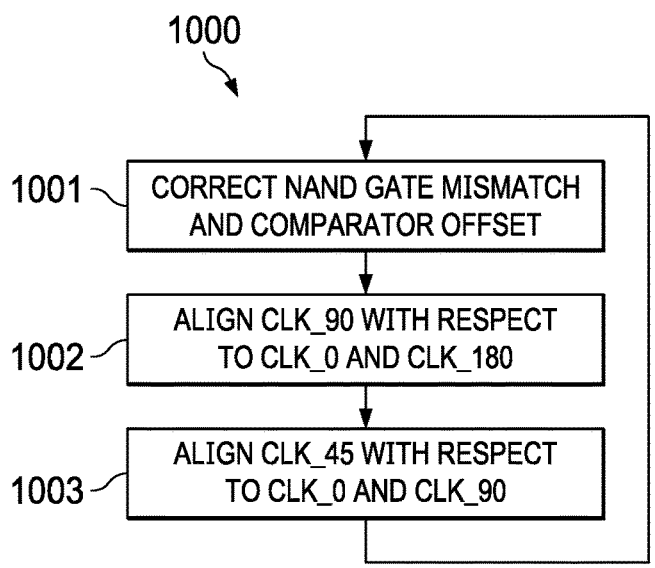
FIG. 10 is a flow diagram of an example logic flow implemented by the clock calibration circuit.

FIG. 10 shows an example of a method 1000 for calibrating the clocks. At block 1001, method 1000 includes correcting the NAND gate mismatch and comparator offset as described above. At block 1002, CLK_90 is then aligned with respect to CLK_0 and CLK_180. At block 1003, CLK_45 is then aligned with respect to CLK_0 and CLK_90. The finite state machine 480 sequences through the operations depicted in FIG. 10 through changes to the selection signals, SEL_MUX_402, SEL_MUX_404, and SEL_MUX_406, and the demultiplexer's control signal 481. Following performance of block 1003, control loops back to block 1001 and the calibration method repeats. In some embodiments, the clock calibration circuit 130 runs continuously in the background while the clocks being calibrated are also used by logic 120.

Figure 11:
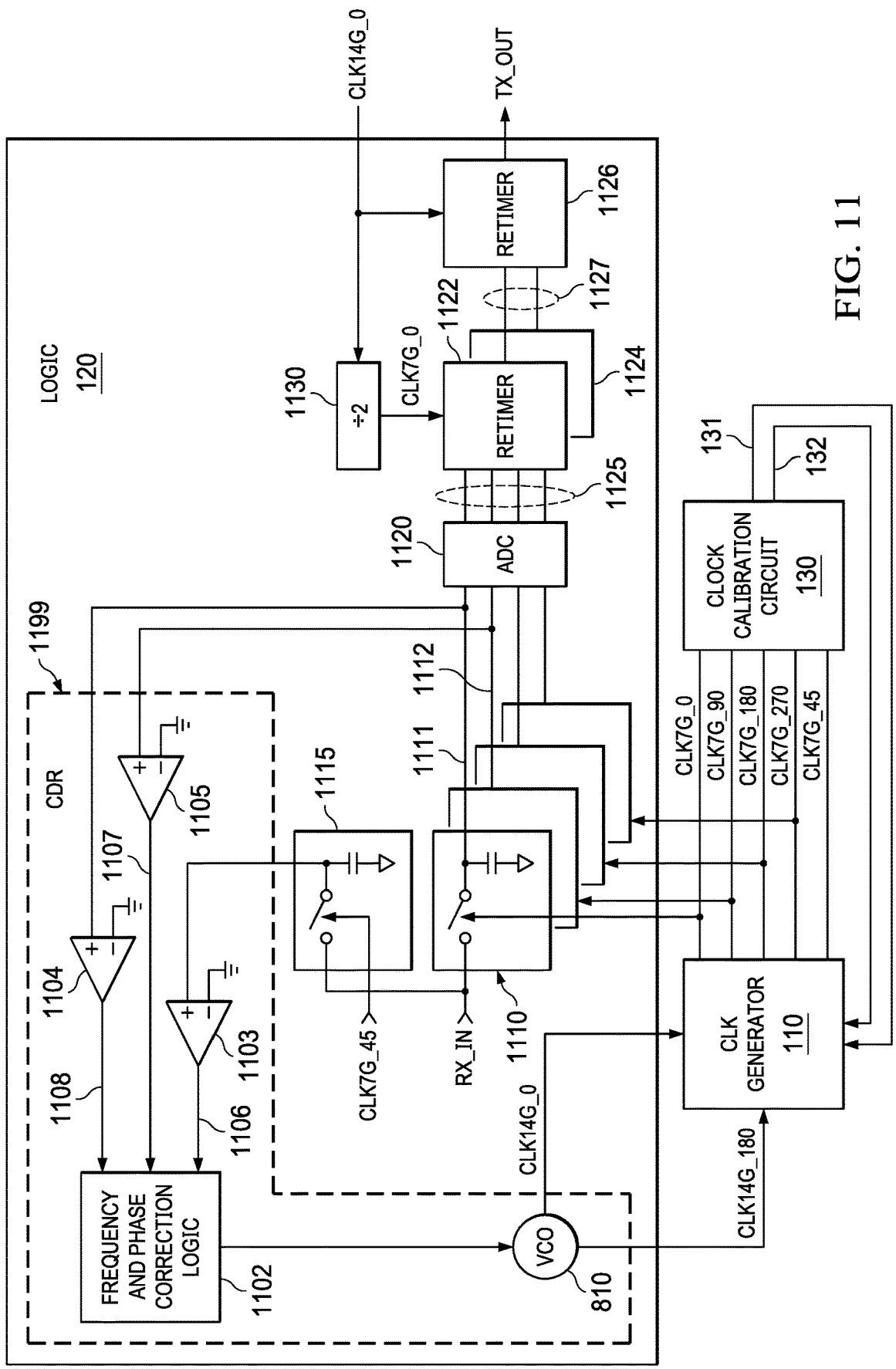
FIG. 11 a block diagram of an example of a data recovery system that includes the clock calibration circuit of FIG. 1.

FIG. 11 shows an example use-case for the clock generator 110 and clock calibration circuit 130. An example implementation of logic 120 is shown. Logic 120 is a retimer system. In this example, encoded input data (RX_IN) is received by logic 120. The encoded input data RX_IN is encoded with a particular clock frequency that is higher than the frequency of the clocks generated by the clock generator 110 (e.g., double or quadruple the frequency of the clocks generated by the clock generator). Logic 120 recovers the data from encoded RX_IN using lower frequency clocks generated by the clock generator 110 and calibrated by the clock calibration circuit 130. The output data, TX_OUT, is the data recovered by the logic 120 from the encoded input data, RX_IN. In FIG. 11, logic 120 uses four quadrature data clocks (CLK7G_0, CLK7G_90, CLK_180, CLK_270) and one edge clock (CLK7G_45) to recover data from the received data stream, RX_IN. The reference to "7G" indicates that the frequency of the data and edge clocks is approximately 7 GHz.

The VCO 810 generates CLK_14G_0 and CLK_14G_180 (14 GHz clocks), from which the clock generator 110 generates clocking signals CLK7G_0, CLK7G_90, CLK_180, CLK_270, and CLK7G_45 as described above. The VCO 810 is shown in FIG. 11 separate from clock generator 110, in other examples, such as that of FIG. 8, the VCO 810 is part of the clock generator 110. The clock calibration circuit 130 functions as described herein.

Logic 120 also includes samplers 1110, each sampler including, for example, a switch and a capacitor as shown. Each of the four data clocks (CLK7G_0, CLK7G_90, CLK_180, CLK_270) is coupled to a control input (to cause the switch to open or close) of a separate samplers 1110. RX_IN is provided to the input of each sampler 1110. Upon a respective clock signal causing the switch to close, the capacitor within that sampler is charged by the voltage of RX_IN. Thus, each sampler 1110 samples RX_IN according to the timing of each of the respective clocks. Each sampler 1110 thus samples RX_IN at a frequency that is less than the frequency of RX_IN. In this example, the sampling frequency of each sampler 1110 is one-fourth the frequency of RX_IN, and the samplers 1110 collectively provide four separate output streams of recovered data that are combined back into a single output stream, TX_OUT, by the retimers 1122, 1124$_{[VM1][HJM2]}$, and 1126 and at the original frequency of RX_IN.

The output of the samplers 1110 are converted to digital values (e.g., 2-bit digital values, but can be other than 2-bit values) by a four-channel analog-to-digital converter (ADC) 1120. The output of the ADC 1120 includes four digital output channels 1125. Two of the output channels are provided to retimer 1122 and the other two output channels are provided to retimer 1124. Each retimer serializes its input digital channels into a single output bit stream 1127. The two output bit streams 1127 from retimers 1022 and 1024 are provided to a third retimer 1126, which serializes the two bit streams 1127 into a single output bit stream as TX_OUT. CLK14G_0, from the VCO 810, is provided to retimer 1126 and to a frequency divider 1130 (e.g., a divide-by-2 divider). The half-rate clock from frequency divider 1130 (CLK7G_0) is provided to retimers 1122 and 1124.

Sampler 1115$_{[VM3][HJM4]}$ samples RX_IN using the CLK7G_45 clock. The sampled output of sampler 1115 and the outputs 1111 and 1112 of samplers 1110 that use the CLK7G_0 and CLK_90 clocks, respectively, are provided to individual comparators 1103, 1104, and 1105 a shown. Each comparator is a "0-comparator" in which the input signal on the non-inverting (positive (+)) input is compared to ground on the inverting (negative (−)) input. The outputs 1106, 1107, and 1108$_{[VM5][HJM6]}$ of the comparators 1103, 1104, and 1105 are coupled to frequency and phase correction logic 1102. The frequency and phase correction logic 1102 generates up and/or down pulses based on the output signals from comparators 1103, 1104, and 1105. The up/down pulses increase or decrease the voltage to the VCO 810 (thereby changing the frequency of the signal output by VCO 810) in order to track the input frequency. VCO 810, frequency and phase correction logic 1102 and comparators 1103-1105 are included in an example of a clock and data recovery (CDR) circuit 1199.

Figure 12:
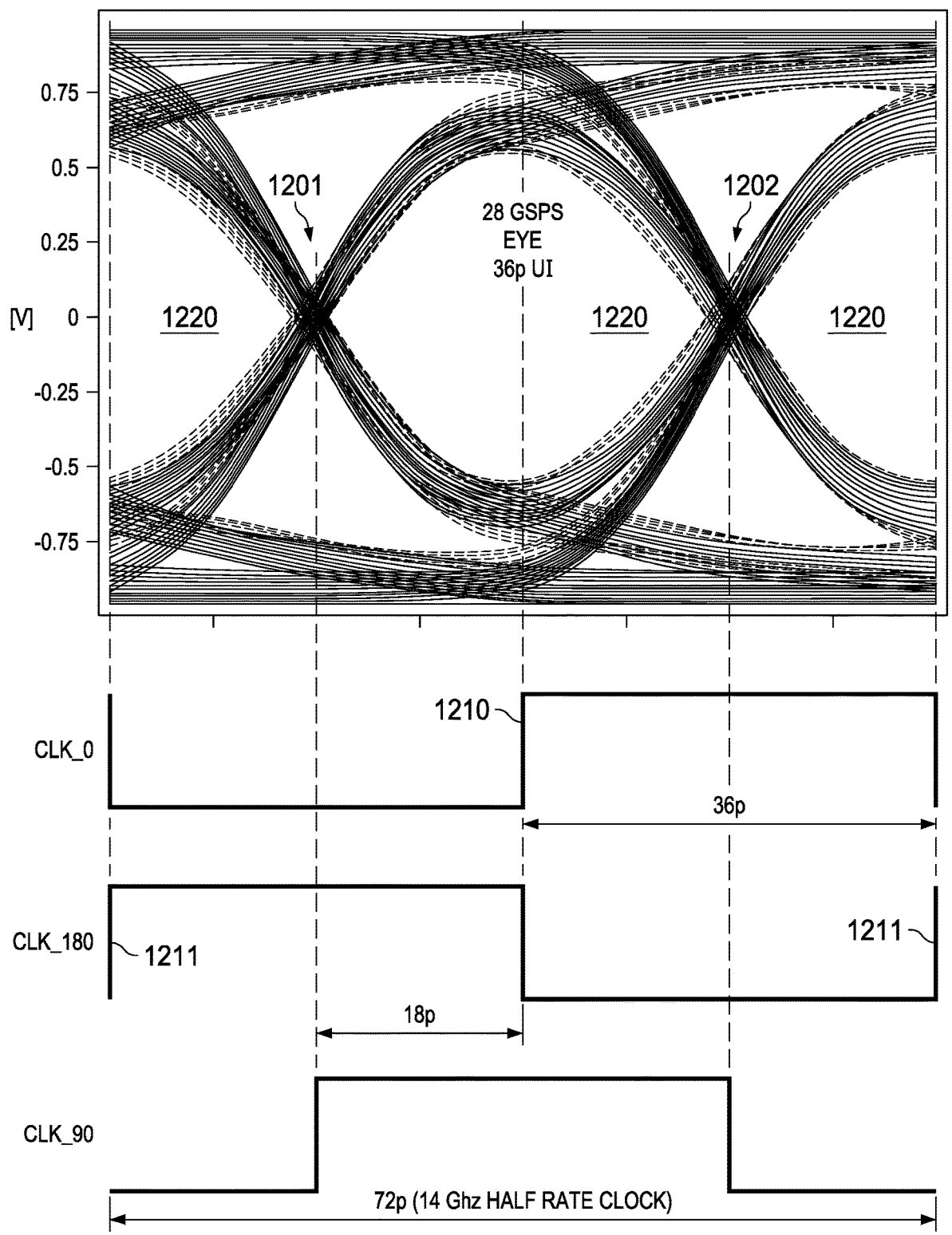
FIG. 12 is a graph of voltage versus time illustrating the phase relationship between clocks calibrated by the clock calibration circuit to recover encoded data received by the data recovery system of FIG. 10.

FIG. 12 shows an example of the use of CLK_0, CLK_180, and CLK_90 to sample incoming data. The edges of CLK_90 should be aligned to the crossover points (1201 and 1202) of the data. With the clocks being properly calibrated via the clock calibration circuit 130, the rising edges 1210 and 1211 of CLK_0 and CLK_180, respectively, will be aligned to the center of the respective "eyes" 1220 to ensure proper sampling of the encoded data.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A circuit, comprising:
   a first circuit input;
   a second circuit input;
   a first multiplexer having a first input, a second input, a control input and an output wherein the first input of the first multiplexer is coupled to the first circuit input and the second input of the first multiplexer is coupled to the second circuit input;
   a third circuit input;
   a fourth circuit input;
   a second multiplexer having a first input, a second input, a control input and an output wherein the first input of the second multiplexer is coupled to the third circuit input and the second input of the second multiplexer is coupled to the fourth circuit input;
   a third multiplexer having a first input, a second input, a control input and an output wherein the first input of the third multiplexer is coupled to the second circuit input and the second input of the third multiplexer is coupled to the third circuit input;
   a first logic gate having:
      a first input coupled to the output of the first multiplexer;
      a second input coupled to the output of the second multiplexer; and
      a first logic gate output, the first logic gate output having a first logic gate output signal with a duty cycle that is a function of a phase difference between a first signal on the first logic gate input and a second signal on the second logic gate input; and
   a second logic gate having:
      a first input coupled to the output of the second multiplexer;
      a second input coupled to the output of the third multiplexer; and
      a second logic gate output, the second logic gate output having a second logic gate output signal with a duty cycle that is a function of a phase difference between the second signal on the first logic gate input of the third logic gate and a third signal on the second input of the third logic gate.

2. The circuit of claim 1, wherein a first input signal having a first phase is applied to the first circuit input, a second input signal having a second phase that is approximately 180 degrees out of phase with the first phase is applied to the second circuit input, a third input signal having a third phase that is approximately 90 degrees out of phase with the first phase is applied to the third circuit input and a fourth input signal having a fourth phase this is approximately 45 degrees out of phase with the first phase is applied to the fourth circuit input.

3. The circuit of claim 1, wherein the first logic gate is a NAND gate and the second logic gate is a NAND gate.

4. The circuit of claim 1, further comprising:
   a first filter having a first filter input coupled to the first logic gate output, and having a first filter output; and
   a second filter having a second filter input coupled to the second logic gate output, and having a second filter output.

5. The circuit of claim 4, wherein the first filter is a low-pass filter, and the second filter is a low-pass filter.

6. The circuit of claim 4, further comprising a comparator having a first comparator input coupled to the first filter output, a second comparator input coupled to the second filter output and a comparator output.

7. The circuit of claim 6, further comprising an accumulator coupled to the comparator output and a digital-to-analog converter (DAC) coupled to the accumulator.

8. The circuit of claim 6, wherein the DAC has an output coupled to the comparator.

9. The circuit of claim 8, further comprising a delay circuit coupled to the output of the DAC.

10. A circuit, comprising:
    a selection circuit having first, second, third, and fourth inputs, one or more selection inputs, and first, second, and third outputs;
    a first logic gate having first and second inputs and a first logic gate output, the first input of the first logic gate coupled to the first output of the selection circuit, and the second input of the first logic gate coupled to the second output of the selection circuit;
    a second logic gate having first and second inputs and a first logic gate output, the first input of the second logic gate coupled to the second output of the selection circuit, and the second input of the second logic gate coupled to the third output of the selection circuit;
    a first filter having a first filter input and a first filter output, the first filter input coupled to the first logic gate output; and
    a second filter having a second filter input and a second filter output, the second filter input coupled to the second logic gate output.

11. The circuit of claim 10, wherein the first logic gate includes a NAND gate, and the second logic gate includes a NAND gate.

12. The circuit of claim 10, wherein the first filter is a low-pass filter, and the second filter is a low-pass filter.

13. The circuit of claim 10, further including a comparator having first and second comparator inputs, the first comparator input coupled to the first filter output, and the second comparator input coupled to the second filter output.

14. The circuit of claim 13, further including:
    an accumulator having an accumulator input coupled to an output of the comparator, the accumulator having an accumulator output;
    a state machine having a state machine input coupled to the accumulator output, the state machine having one or more control outputs coupled to the respective one or more selection inputs of the selection circuit.

15. The circuit of claim 14, wherein the state machine is configured to assert the one or more control outputs so as to sequentially cause:
    the selection circuit to couple a selective pair of the first, second, third, and fourth inputs to the first and second inputs of the first logic gate and to couple the selective pair to the second and first inputs of the second logic gate;
    the selection circuit to couple the second and first inputs to the first and second inputs of the first logic gate and to couple the first and third inputs to the first and second inputs of the second logic gate; and
    the selection circuit to couple the first and fourth inputs to the first and second inputs of the first logic gate and to couple the fourth and third inputs to the first and second inputs of the second logic gate.

16. A method, comprising:
    adjusting an offset of a comparator;

adjusting, using the comparator, a delay of a first clock with respect to a second clock and a third clock, the first, second, and third clocks having approximately the same frequency; and adjusting, using the comparator, a delay of a fourth clock with respect to first and second clocks, the fourth clock having approximately the same frequency as the first, second, and third clocks.

17. The method of claim 16, wherein adjusting the offset of the comparator comprises:

NANDing, with a first NAND gate, separate clocks to generate a first NAND gate output;

NANDing, with a second NAND gate, the separate clocks to generate a second NAND gate output;

filtering, using a first filter, the first NAND gate output; and filtering, using a second filter, the second NAND gate output.

18. The method of claim 17, wherein the first filter has an output, the second filter has an output, and the method further comprises comparing the outputs of the first and second filters.

19. The method of claim 16, wherein adjusting the delay of the first clock with respect to the second and third clocks comprises:

providing the second clock to a first input of a first NAND gate and the first clock to a second input of the first NAND gate, the first NAND gate having an output;

providing the first clock to a first input of a second NAND gate and the third clock to a second input of the second NAND gate, the second NAND gate having an output;

filtering, using a first filter, the output of the first NAND gate, the first filter having an output;

filtering, using a second filter, the output of the second NAND gate, the second filter having an output; and comparing the outputs of the first and second filters.

20. The method of claim 16, wherein adjusting the delay of the fourth clock with respect to the first and second clocks comprises:

providing the second clock to a first input of a first NAND gate and the fourth clock to a second input of the first NAND gate, the first NAND gate having an output;

providing the fourth clock to a first input of a second NAND gate and the first clock to a second input of the second NAND gate, the second NAND gate having an output;

filtering, using a first filter, the output of the first NAND gate, the first filter having an output;

filtering, using a second filter, the output of the second NAND gate, the second filter having an output; and comparing the outputs of the first and second filters.

21. A circuit, comprising:

a selection circuit having first, second, third, and fourth inputs, one or more selection inputs, and first, second, and third outputs, and in response to signals on the one or more selection inputs, the selection circuit is configured to selectively couple the first or second input to the first output, the third or fourth input to the second output, and the second or third input to the third output; and a logic gate circuit coupled to the first, second, and third outputs of the selection circuit, the logic gate circuit having first and second logic gate circuit outputs, and the logic gate circuit configured to generate a first signal on the first logic gate circuit output and to generate a second signal on the second logic gate circuit output, the first signal having a duty cycle that is function of a phase difference between signals on the first and second outputs of the selection circuit, and the second signal having a duty cycle that is function of a phase difference between signals on the second and third outputs of the selection circuit;

wherein the selection circuit comprises:

a first multiplexer coupled to the first and second inputs of the selection circuit and having the first output of the selection circuit;

a second multiplexer coupled to the third and fourth inputs of the selection circuit and having the second output of the selection circuit; and a third multiplexer coupled to the second and third inputs of the selection circuit and having the third output of the selection circuit.

22. A circuit, comprising:

a selection circuit having first, second, third, and fourth inputs, one or more selection inputs, and first, second, and third outputs, and in response to signals on the one or more selection inputs, the selection circuit is configured to selectively couple the first or second input to the first output, the third or fourth input to the second output, and the second or third input to the third output; and a logic gate circuit coupled to the first, second, and third outputs of the selection circuit, the logic gate circuit having first and second logic gate circuit outputs, and the logic gate circuit configured to generate a first signal on the first logic gate circuit output and to generate a second signal on the second logic gate circuit output, the first signal having a duty cycle that is function of a phase difference between signals on the first and second outputs of the selection circuit, and the second signal having a duty cycle that is function of a phase difference between signals on the second and third outputs of the selection circuit;

wherein the logic gate circuit includes:

a first NAND gate having a first NAND gate input coupled to the first output of the selection circuit, a second NAND gate input coupled to the second output of the selection circuit, and a first NAND gate output that is the first logic gate circuit output; and a second NAND gate having a third NAND gate input coupled to the second output of the selection circuit, a fourth NAND gate input coupled to the third output of the selection circuit, and a second NAND gate output that is the second logic gate circuit output.

23. The circuit of claim 22, further comprising:

a first filter having a first filter input coupled to the first NAND gate output, and having a first filter output; and a second filter having a second filter input coupled to the second NAND gate output, and having a second filter output.

24. A circuit, comprising:

a selection circuit having first, second, third, and fourth inputs, one or more selection inputs, and first, second, and third outputs, and in response to signals on the one or more selection inputs, the selection circuit is configured to selectively couple the first or second input to the first output, the third or fourth input to the second output, and the second or third input to the third output; and a logic gate circuit coupled to the first, second, and third outputs of the selection circuit, the logic gate circuit having first and second logic gate circuit outputs, and the logic gate circuit configured to generate a first signal on the first logic gate circuit output and to generate a second signal on the second logic gate circuit output, the first signal having a duty cycle that is function of a phase difference between signals on the first and second outputs of the selection circuit, and the second signal having a duty cycle that is function of a phase difference between signals on the second and third outputs of the selection circuit;

further comprising:

a first low-pass filter coupled to the first logic gate circuit output and configured to low-pass filter the first signal to produce a first filtered output signal on a first filter output;

a second low-pass filter coupled to the second logic gate circuit output and configured to low-pass filter the second signal to produce a second filtered output signal on a second filter output;

a comparator having a first comparator input and a second comparator input, the first comparator input coupled to the first filter output, and the second comparator input coupled to the second filter output;

an accumulator having an input coupled to an output of the comparator;

a digital-to-analog converter (DAC) having a digital input coupled to the accumulator and having an analog output; and a delay circuit coupled having a delay circuit input and a delay circuit output, the delay circuit output coupled to at least one of the third or fourth inputs of the selection circuit, the delay circuit also having a control input coupled to the analog output of the DAC.

* * * * *